United States Patent
Lee et al.

(10) Patent No.: US 9,846,195 B2
(45) Date of Patent: Dec. 19, 2017

(54) APPARATUS AND METHOD FOR ESTIMATING INTERNAL RESISTANCE OF BATTERY

(71) Applicant: SK Innovation Co., Ltd., Seoul (KR)

(72) Inventors: Sungeun Lee, Seoul (KR); Shanshan Jin, Daejeon (KR); Siyoung Jang, Icheon-si (KR); Hyungjoon Kim, Seoul (KR)

(73) Assignee: SK Innovation Co., Ltd., Seoul (KR)

( * ) Notice: Subject to any disclaimer, the term of this patent is extended or adjusted under 35 U.S.C. 154(b) by 1060 days.

(21) Appl. No.: 13/681,937

(22) Filed: Nov. 20, 2012

(65) Prior Publication Data
US 2013/0138373 A1    May 30, 2013

(30) Foreign Application Priority Data
Nov. 24, 2011 (KR) .................. 10-2011-0123261

(51) Int. Cl.
*G01R 31/36* (2006.01)
*G06F 19/00* (2011.01)

(52) U.S. Cl.
CPC ..... *G01R 31/3613* (2013.01); *G01R 31/3662* (2013.01); *G06F 19/00* (2013.01); *G01R 31/3648* (2013.01)

(58) Field of Classification Search
CPC ............ G01R 31/3613; G01R 31/3662; G01R 31/3648; G06F 19/00
See application file for complete search history.

(56) References Cited

U.S. PATENT DOCUMENTS

| | | | |
|---|---|---|---|
| 2004/0128089 A1 | 7/2004 | Barsoukov et al. | |
| 2006/0066285 A1 | 3/2006 | Minamiura | |
| 2008/0091362 A1* | 4/2008 | Tae ................... | G01R 31/3662 702/63 |
| 2009/0099802 A1* | 4/2009 | Barsoukov ......... | G01R 31/3662 702/65 |
| 2011/0112782 A1* | 5/2011 | Majima ............... | G01R 31/361 702/63 |
| 2012/0004875 A1* | 1/2012 | Maeda ................. | H01M 10/48 702/63 |

FOREIGN PATENT DOCUMENTS

| | | |
|---|---|---|
| JP | 201019758 A | 1/2010 |
| JP | 201042766 A | 2/2010 |
| KR | 1020110006266 A | 1/2011 |

* cited by examiner

*Primary Examiner* — Mohamed Charioui
*Assistant Examiner* — Jeremy Delozier
(74) *Attorney, Agent, or Firm* — The Webb Law Firm

(57) ABSTRACT

Provided are an apparatus and a method for estimating internal resistance of a battery pack. The apparatus includes: a voltage sensing unit that measures a voltage value of the battery pack; a current sensing unit that measures a current value of the battery pack; a temperature sensing unit that measures a temperature value of the battery pack; and a microprocessor unit (MCU) that calculates the internal resistance of the battery pack using values transferred from the voltage sensing unit, the current sensing unit, and the temperature sensing unit.

9 Claims, 7 Drawing Sheets

APPARATUS AND METHOD FOR ESTIMATING INTERNAL RESISTANCE OF BATTERY

CROSS-REFERENCE TO RELATED APPLICATIONS

This application claims priority under 35 U.S.C. §119 to Korean Patent Application No. 10-2011-0123261, filed on Nov. 24, 2011, in the Korean Intellectual Property Office, the disclosure of which is incorporated herein by reference in its entirety.

TECHNICAL FIELD

The following disclosure relates to calculation of internal resistance of a battery pack, and more particularly, to an apparatus and method for estimating internal resistance of a battery pack capable of calculating internal resistance of the battery pack by observing a change in current flowing in the battery pack and using a current value satisfying a set current change condition and a voltage value according to the current value.

BACKGROUND

A vehicle using an internal combustion engine using gasoline or heavy oil as main fuel has a serious effect on generation of pollution such as air pollution, or the like.

Therefore, in order to reduce the generation of the pollution, an electric vehicle or a hybrid electric vehicle has been recently developed actively.

The electric vehicle is a vehicle operated using only electric energy output from a battery. Since the electric vehicle uses a battery in which a plurality of secondary batteries that may be charged and discharged are formed as a single pack as a main power source, it does not generate exhaust gas and has significantly small noise.

Meanwhile, the hybrid vehicle, which is an intermediate stage vehicle between a vehicle using an internal combustion engine and an electric vehicle, is a vehicle using two or more power sources, for example, an internal combustion engine and a battery engine.

In the vehicle using the electric energy as described above, since performance of a battery has a direct effect on performance of the vehicle, performance of each battery cell should be excellent. In addition, a battery managing system capable of efficiently managing charging and discharging and a lifespan of each battery cell by measuring voltage of each battery cell, voltage and current of the entire battery, and the like, has been urgently demanded.

Korean Patent Laid-Open Publication No. 2011-0006266 has disclosed a method for measuring internal resistance of a cell in a high voltage battery for a vehicle. The method for measuring internal resistance of a cell in a high voltage battery for a vehicle disclosed in Korean Patent Laid-Open Publication No. 2011-0006266 includes: measuring current and voltage of a battery; and receiving the measured current and voltage values and measuring battery resistance by a method of least squares.

The present invention relates to an apparatus and method for estimating internal resistance of a battery pack by observing a change in current used in the battery pack and using a current value satisfying a set current change condition and a voltage and temperature values according to the current value, as described above.

Since conditions specified in Korean Patent Laid-Open Publication No. 2011-0006266 are different in a standard and a feature from those of the present invention and correspond to conditions at a step following a step specified in the present invention, Korean Patent Laid-open Publication No. 2011-0006266 is not similar to the present invention.

RELATED ART DOCUMENT

Patent Document

Korean Patent Laid-Open Publication No. 2011-0006266

SUMMARY

An embodiment of the present invention is directed to providing an apparatus and method for estimating internal resistance of a battery pack capable of calculating internal resistance of the battery pack by observing a change in current used in the battery pack and using a current value satisfying a set current change condition and a voltage value according to the current value.

In one general aspect, an apparatus for estimating internal resistance of a battery pack includes: a voltage sensing unit that measures a voltage value of the battery pack; a current sensing unit that measures a current value of the battery pack; a temperature sensing unit that measures a temperature value of the battery pack; and a microprocessor unit (MCU) that calculates the internal resistance of the battery pack using values transferred from the voltage sensing unit, the current sensing unit, and the temperature sensing unit.

The MCU may include: a condition initializing unit that initializes a condition variable required for setting a condition using a current value measured in advance in the current sensing unit; a current, voltage, and temperature measuring unit that stores the current value, the voltage value, and the temperature value received from the voltage sensing unit, the current sensing unit, and the temperature sensing unit, respectively, in an arbitrarily set variable; a current condition judging unit that judges whether the measure current value satisfies a set current value condition; and a current value, voltage value, and temperature value storing unit that extracts and stores a current value satisfying the current value condition and stores the voltage and temperature values of the battery pack measured together with the current value at the time of the measurement of the current value, and the MCU may estimate the internal resistance of the battery pack using stored current values, stored voltage values, and stored temperature values obtained by repeating a process of extracting and storing the current value satisfying the current value condition two times or more.

The current sensing condition judging unit may include: an initial condition judging unit that judges a condition of an initial current value sensed in the current sensing unit to judge whether the condition of the initial current value is a condition appropriate for extracting the current value; a condition range setting unit that sets a current value section to be extracted using the initial current value when it is judged in the initial condition judging unit that the condition of the initial current value is the condition appropriate for extracting the current value; a cycle counting unit that counts a time when a current value measured after the initial current value in the current sensing unit is included in the current value section set in the condition range setting unit; a current value extracting unit that repeats the cycle counting operation until the time counted in the cycle counting unit becomes a preset time and extracts a current value in the case in which the counted time becomes the preset time as a result of the repetition; and a current value resetting unit that does not extract current values after one current value is first extracted in the current value extracting unit and before the current value enters a low current section and resets the current value when the current value enters the low current section.

The condition initializing unit may include a variable initializing unit that initializes a variable value storing an initial current value and a variable value counting condition satisfaction to 0.

The initial condition judging unit may include an initial condition judging calculating unit that judges whether the initial current value is out of a preset low current section and compares an absolute value of the initial current value and an absolute value of the previous current value with each other to judge whether the condition of the initial current value is the condition appropriate for extracting the current value.

The condition range setting unit may include: an upper and lower limit width calculating unit that calculates upper and lower limit widths of the current value section by multiplying the initial current value by a preset ratio; and a current ranging determining unit that determines upper and lower limits of the current value section through the upper and lower limit widths calculated in the upper and lower limit width calculating unit.

The current value resetting unit may include: an additional current value extracting limiting unit that repeatedly performs the operations before the current value resetting unit to allow the current values other than the current value first extracted in the current value extracting unit not to be additionally extracted; and a process initializing unit that repeatedly performs the additional current value extracting limiting operation until the current values extracted in the additional current value extracting unit become a value in the low current section and allows a process to again start from the condition initializing unit in the case in which the current values become the value in the low current section as a result of the repetition.

In another general aspect, a method for estimating internal resistance of a battery pack, includes: a current, voltage, and temperature value extracting step of extracting a current value satisfying a predetermined condition and voltage and temperature values according to the current value; a repeating step of repeating the current, voltage, and temperature value extracting step two times or more; and an internal resistance calculating step of calculating the internal resistance of the battery pack using values calculated in the repeating step.

The current, voltage, and temperature value extracting step may include: a current value measuring step of measuring a current value of the battery pack every preset period; a condition range setting step of setting a current value section to be extracted using an initial current value first measured in the current value measuring step; a cycle counting step of counting a time in the case in which a current value measured after the initial current value in the current value measuring step is included in the current value section set in the condition range setting step; a current value extracting step of repeating the cycle counting step until the time counted in the cycle counting step becomes a preset time and extracting a current value in the case in which the counted time becomes the preset time as a result of the repetition; a current value resetting step of allowing current values not to be extracted after one current value is first extracted in the current value extracting step and before the current value enters a low current section and resetting the current value and allowing a process to again start from the current value measuring step when the current value enters the low current section; and an internal resistance calculating step of calculating the internal resistance of the battery pack using a current value and a voltage value extracted by repeating the current value extracting step two times or more.

The condition range setting step may include: an upper and lower limit width calculating step of calculating upper and lower limit widths of the current value section by multiplying the initial current value by a preset ratio; and a current ranging determining step of determining upper and lower limits of the current value section through the upper and lower limit widths calculated in the upper and lower limit width calculating step.

The current value resetting step may include: an additional current value extracting limiting step of repeatedly performing the steps before the current value resetting step to allow the current values other than the current value first extracted in the current value extracting step not to be extracted; and a process initializing step of repeatedly performing the additional current value measuring step until the current values measured in the additional current value extracting step become a value in the low current section and allowing the process to again start from the current value measuring step in the case in which the current values become the value in the low current section as a result of the repetition.

DETAILED DESCRIPTION OF MAIN ELEMENTS

S110: Battery pack
S120: Apparatus for estimating internal resistance

DETAILED DESCRIPTION OF EMBODIMENTS

Hereinafter, exemplary embodiments of the present invention will be described in detail with reference to the accompanying drawings.

Figure 1:
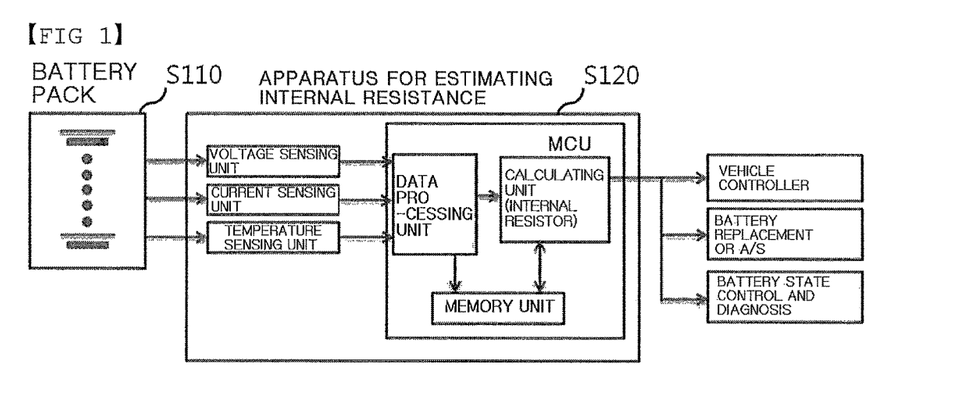
FIG. 1 is a diagram schematically showing a configuration of an apparatus for estimating internal resistance of a battery pack according to an exemplary embodiment of the present invention.

FIG. 1 is a system configuration diagram schematically showing an apparatus for estimating internal resistance of a battery pack according to an exemplary embodiment of the present invention. The system shown in FIG. 1 is mainly configured of a battery pack S110, an apparatus S120 for estimating internal resistance including a microcontroller unit (MCU) receiving data from a sensing unit sensing voltage, current, and temperature of the battery pack and estimating internal resistance, and the like.

In a method for estimating internal resistance of a battery pack according to an exemplary embodiment of the present invention, which is a preprocessing operation for calculating the internal resistance of the battery pack, a current value is not extracted every second or every predetermined time, but a current value satisfying a predetermined condition is extracted and then used to calculate the internal resistance of the battery pack.

Figure 2:
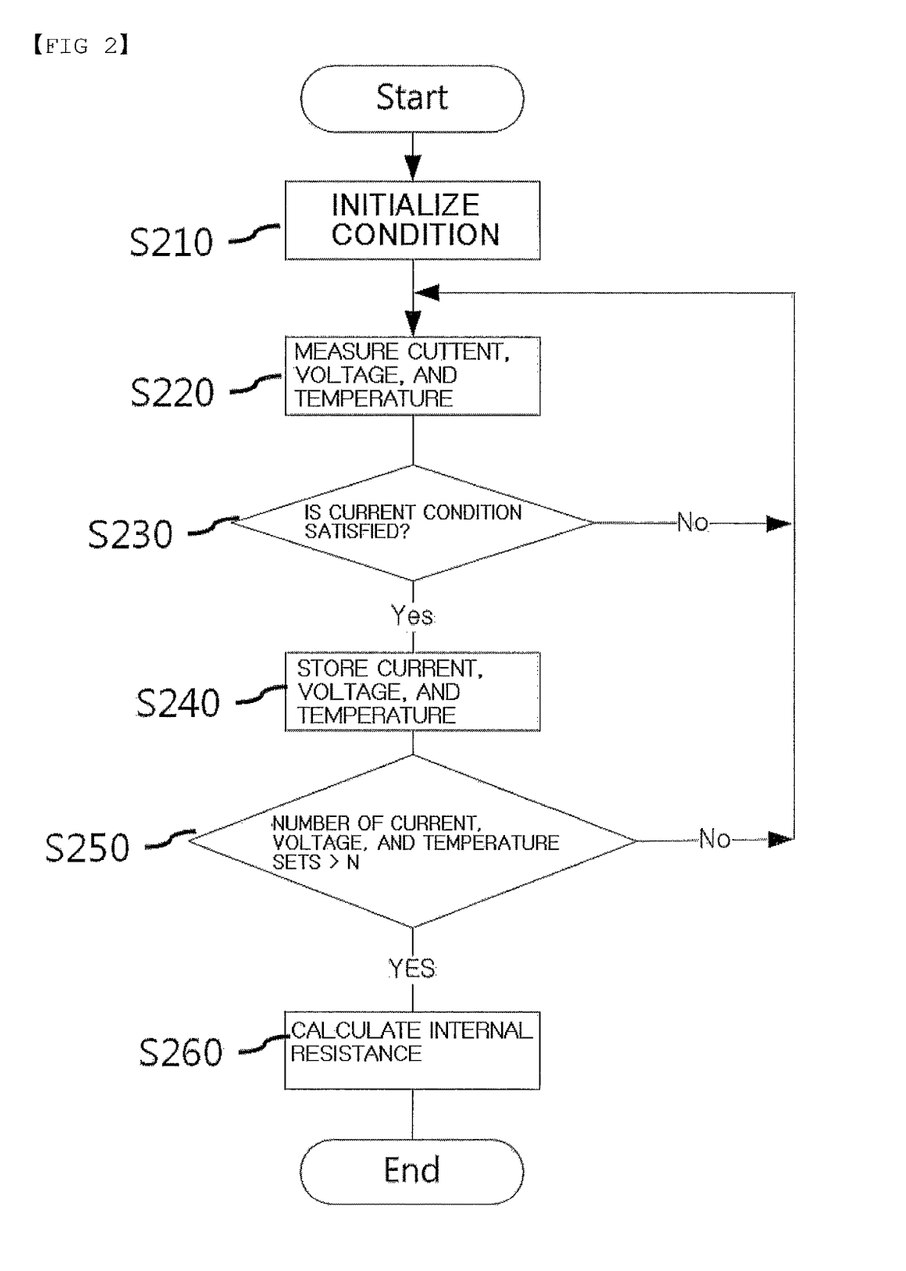
FIG. 2 is a flow chart schematically showing a method for estimating internal resistance of a battery pack according to an exemplary embodiment of the present invention.

FIG. 2 is a flow chart schematically showing a method for estimating internal resistance of a battery pack according to an exemplary embodiment of the present invention. First, a current sensing unit sensing current of the battery pack initializes a condition variable required for calculating the internal resistance using an existing measured current value (S210), measures current, voltage, and temperature of the battery pack (S220), judges whether the measured current value satisfies a set current value condition (S230), and then stores the current value satisfying the current condition and the voltage and temperature values of the battery pack measured together with the current value at the time of the measurement of the current value (S240). When a process of extracting and storing a current value satisfying the above-mentioned current condition is repeated two times or more (S250), the internal resistance of the battery pack is estimated using two sets or more of stored current, voltage, and temperature values.

Figure 3:
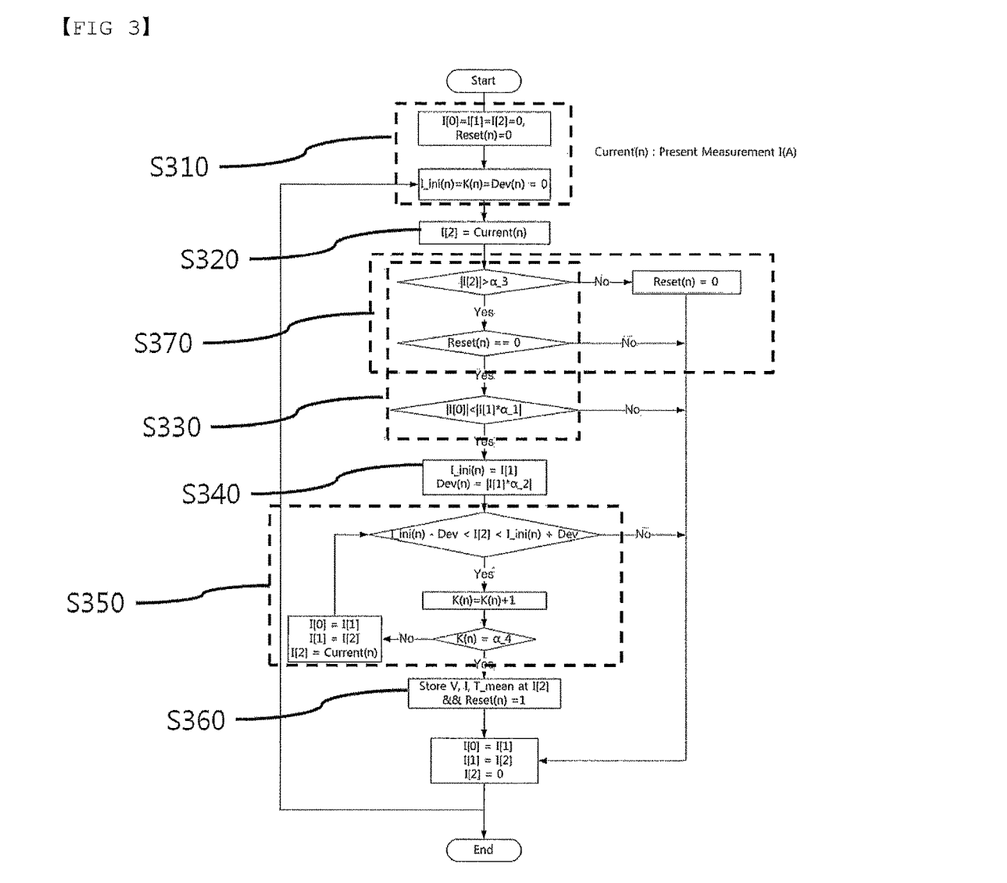
FIG. 3 is a detailed flow chart showing the method for estimating internal resistance of a battery pack according to the exemplary embodiment of the present invention in detail.

FIG. 3 is a detailed flow chart showing the method for estimating internal resistance of a battery pack according to the exemplary embodiment of the present invention in detail. A detailed description thereof will be provided below.

First, variable values I[0], I[1], I[2], and I_ini(n) storing an initial current value required for setting a condition in advance, Reset(n) used to judge current value reset, a variable value K(n) counted by satisfying a current condition, and Dev(n) for determining upper and lower limit widths are initialized to 0 (S310).

After step S310 is performed, a current value of the battery pack is measured every set measurement period (S320).

It is judged that the initial current value measured in step (S320) is in a section between −a_3 and +a_3, which is a low current section, and it is judged that the initial current value is compared with a value generated by I[0] and I[1], which are stored current values of the previous step, by a predetermined ratio (a_1) in an absolute value unit to satisfy a condition in the case in which the initial current value is out of the low current section (S330).

In step (S330), since Reset(n) has an initial value of 0, it needs not to be considered at the initial stage.

When the condition of step (S330) is satisfied, I[1], which is the current value of the previous step in which the current value (Current(n)) measured in step (S320) is stored, is set to an initial current value (I_ini(n)), and a current value section to be estimated is set using the firstly measure initial current value (S340).

In step (S340), I[1], which is the stored current value of the previous step, is multiplied by a preset ratio, such that the upper and lower limit widths of the current value section may be calculated and upper and lower limits of the current value section may be determined through the calculated upper and lower limit widths. The stored current value (I[1]) of the previous step is multiplied by a predetermined ratio ($\alpha\_2$) to calculate the upper and lower limit widths (Dev(n)) of the current value section. For example, in the case in which the stored current value I[1]) of the previous step is 10 A and the predetermined ratio ($\alpha\_2$) is 0.3, the upper and lower limit widths (Dev(n) of the current value section are 3 A. In this case, the current value section may be between 7 A and 13 A.

In the case in which a current value measured after the initial current value in step (S320) is included in the current value section set in step (S340), a time is counted (S350). That is, it is judged that the current value (I[2]) measured after the stored current value (I[1]) of the previous step is in a condition range (that is, a range of I_ini(n)−Dev(n) to I_ini(n)+Dev(n)) set in step (S340). When it is judged that the above-mentioned condition is satisfied, 1 is added to an initial time (K(n)=0), and step (S350) is repeated until an addition result (K(n+1)) becomes a predetermined time ($\alpha\_4$).

As described above, in the case in which a counted time becomes a predetermined time as a result of repeating step (S350), a current value at this time is extracted (S360). In step (S360), a current value, a voltage value, and an average temperature of cells at the predetermined time (K(n+1)) are extracted.

In the case in which a current value measured after one current value is first extracted satisfies a current value reset step in step (S360), a process returns to step (S330) (S370).

In step (S370), steps (S330 to S350) before step (S360) are repeatedly performed, such that current values other than a current value first extracted in step (S360) are not extracted, and step (S330) again starts when the current value becomes a value in a low current section. There may be several current values satisfying the condition mentioned in step (S350). However, remaining current values other than first extracted one current value are unreliable. Therefore, an object of adding step (S370) to step (S360) is to handle only a first extracted current value without extracting the unreliable remaining current values. In this case, when the current value becomes the value in the low current section, current value initial condition judgment (step (S330)) may be performed. In step (S370), a Reset(n) value is set to 1 when the current value is first extracted in step (S360). Then, when the measured current value (Current(n)) is in the low current section, that is, the section between −$\alpha\_3$ and +$\alpha\_3$, the Reset(n) value becomes 0, and the process returns to step (S310). When the unreliable current value (Current(n)) is reset in step (S370), the process is initialized, such that the initial time (K(n)), the initial current value (I_ini(n)), Dev(n) of step (S320) become 0.

In step (S260) of FIG. 2, the internal resistance of the battery pack is calculated using a current value and a voltage value extracted by repeating step (S360) two times or more. For example, in step (S260), the internal resistance of the battery pack may be estimated by a J_Pulse method. Briefly describing this, the internal resistant may be estimated by a change amount in a voltage value according to a change amount in a current value using a voltage value at a predetermined reference time, for example, ten seconds, according to stepwise charging and discharging current.

In addition, the reason why the average temperature value of the cell is extracted and stored in addition to the extracted current value and voltage value is to compare internal resistance values for each temperature calculated in advance through an experiment with the calculated internal resistance values.

Figure 4:
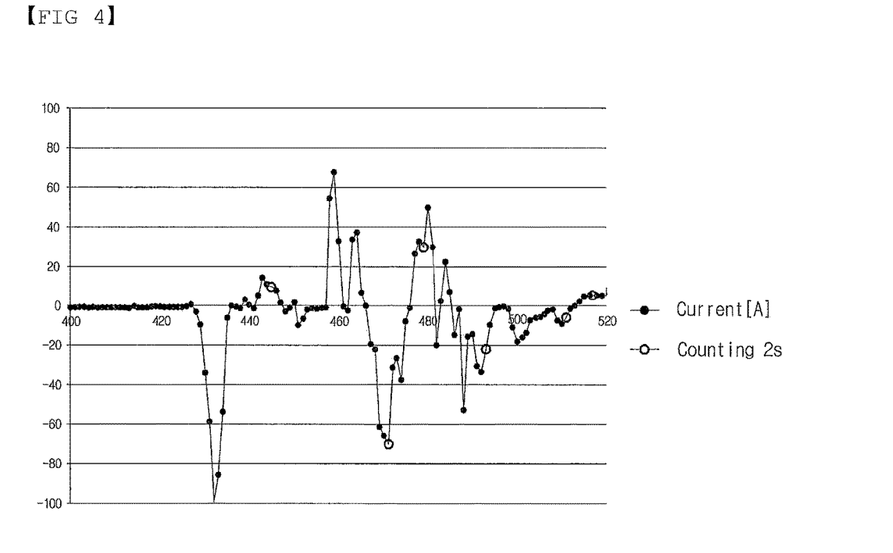
FIG. 4 is a diagram showing an example of a result of estimating a current value of the method for estimating internal resistance of a battery pack according to the exemplary embodiment of the present invention.

FIG. 4 is a diagram showing an example of a result of estimating a current value of the method for estimating internal resistance of a battery pack according to the exemplary embodiment of the present invention. In FIG. 4, a result of the case in which predetermined ratios ($\alpha\_1$ and $\alpha\_2$) are 0.3, an upper limit ($\alpha\_3$) of a low current section is 3 A, a counting predetermined time ($\alpha\_4$) is 2 seconds is shown.

As shown in FIG. 4, the internal resistance of the battery pack is calculated by extracting only current values satisfying a set condition from current values measured every second. In this case, an extraction period of the current value required for calculating the internal resistance of the battery pack is based on an extracted current value rather than a time.

The internal resistance of the battery pack may be calculated using the current value extracted as shown in FIG. 4 and the voltage value and temperature value that correspond to the current value.

$$IR = \Delta V / \Delta I \qquad \text{[Equation 1]}$$

Figure 5:
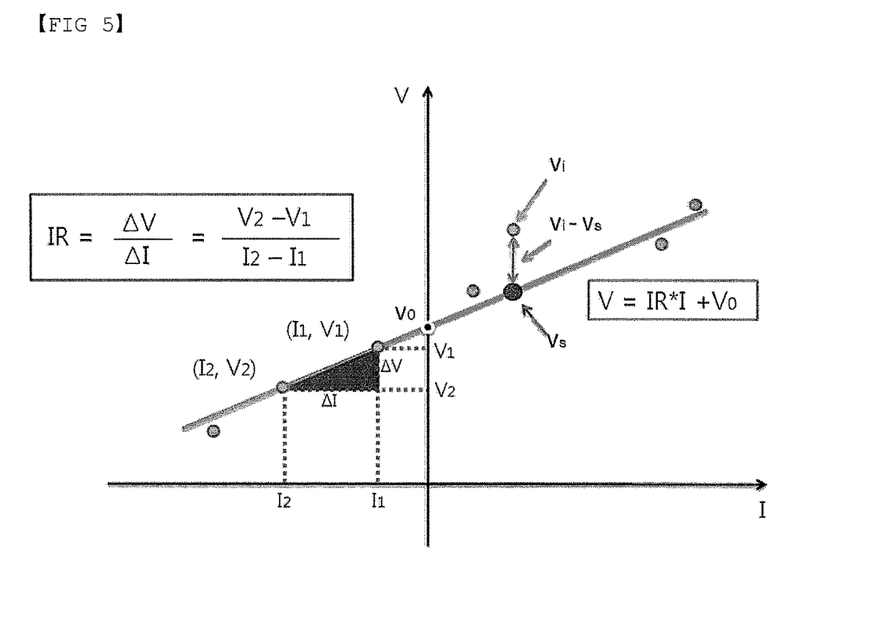
FIG. 5 is a flow chart showing an example of a method for calculating internal resistance of a battery pack according to the exemplary embodiment of the present invention.

FIG. 5 is a flow chart showing an example of a method for calculating internal resistance of a battery pack according to the exemplary embodiment of the present invention. Here, a basic approach for calculating internal resistance is represented by Equation 1.

For example, after an I1 value equal to or larger than a value in a set low current section and a V1 value according to the I1 value are extracted, when it is assumed that a current value in a state in which current does not flow is I0 and a voltage value in this state is V0, an IR value may be calculated as represented by Equation 2.

$$IR = \frac{(V_0 - V_1)}{I_0 - I_1} \qquad \text{[Equation 2]}$$

However, in the case in which the IR value is calculated using only a single datum, since reliability is deteriorated, the IR value may be calculated by extracting and using two or more. In the case in which two or more data are extracted, the IR value may be calculated as represented by Equation 3.

$$IR = \frac{(V_2 - V_1)}{I_2 - I_1} \qquad \text{[Equation 3]}$$

When this basic concept for calculating the internal resistance is extended, a method of least squares capable of evaluating reliability simultaneously with estimating an optimal value in consideration of several extracted data may be used.

When it is assumed that an optimal function capable of being calculated based on the extracted current and voltage values is Equation 4, a difference between an estimated straight line value V and an actually measured value $V_i$ value will become the minimum.

$$V = IR*I + V_0 \qquad \text{[Equation 4]}$$

The method of least squares is a method for minimizing a square of this deviation. When it is assumed that the sum of the square of the deviation is $x_2$, $x_2$ is calculated as represented by Equation 5.

$$X^2 = \Sigma(V_i - V)^2 = \Sigma(V_i - (IR*I_i V_0)) \qquad \text{[Equation 5]}$$

Here, in order to find a straight line appropriate for data, this error may be reduced as much as possible. That is, an IR value and a $V_0$ value should be values for minimizing $x_2$, respectively.

In order to calculate the IR value and the $V_0$ value, when it is assumed that the number of extracted data is N, values generated by performing partial differential on IR and $V_0$, respectively, need to be 0.

$$\frac{\partial X^2}{\partial V0} = -2\sum V_i + 2*IR \sum I_i + 2*V_0*N = 0 \qquad \text{[Equation 6]}$$

$$\frac{\partial X^2}{\partial IR} = -2\sum V_i*I_i + 2*IR\sum I_i + 2*V0\sum I_i^2 = 0 \qquad \text{[Equation 7]}$$

Final results obtained by calculating IR and $V_0$ satisfying these Equations are as follows.

$$V0 = [(\Sigma I_i^2)(\Sigma V_i) - (\Sigma I_i)(\Sigma I_i * V_i)] / [N*(\Sigma I_i^2) - (\Sigma I_i)^2] \qquad \text{[Equation 8]}$$

$$IR = [N*(\Sigma I_i * V_i) - (\Sigma I_i)(\Sigma V_i)] / [N*(\Sigma I_i^2) - (\Sigma I_i)^2] \qquad \text{[Equation 9]}$$

The calculated IR value may be considered as an optimal value calculated based on two sets or more of N extracted current and voltage values. However, another method is required in order to judge reliability of the calculated IR value. Appropriateness of the calculated IR value may be judged through r2 calculation, which represents a reference indicating how well a correlation between two data is represented as a numerical meaning.

A correlation coefficient r has a value between and 1. In the case in which all data accurately coincide with a straight line, r becomes 1. In the case in which all data do not coincide with the straight line, but approaches the straight line, r has a value close to 1, and in the case in which all data coordinates on a graph are uniformly distributed, such that they do not approach the straight line, r becomes 0. This means that there is no linear relationship between two data sets.

In order to calculate the correlation coefficient (r) value, a mean of all V values should be first calculated. A straight line $V_{mean}$ indicating a mean of V on the graph passes through an approximately intermediate height of all V values. The reason why $V_{mean}$ is calculated is that a mean straight line is the worst model among straight lines capable of representing corresponding data and other straight lines are compared and evaluated based on the mean straight line.

When all of the differences between actual values and mean values are calculated and summed up, a value becomes 0 by definition of the mean. Therefore, in order to solve this problem, all values are squared so as to be positive numbers and the positive numbers are then summed up.

$$\Sigma(V_i - V_{mean})^2 \qquad \text{[Equation 10]}$$

This value will be used as a means for comparing the appropriateness of the optimal function calculated as described above. In the case in which this value is small, it means that all data approaches the mean, and in the case in which this value is large, it means that the data are widely distributed.

Next, V values corresponding to each I value may be calculated as represented by Equation 11 using an optimal straight line equation for the data.

$$V_{cal} = V_0 + IR*I_i \qquad \text{[Equation 11]}$$

The sum of a square of a difference between a measured value and a straight line value is calculated by the same method. This is represented by Equation 12.

$$\Sigma(V_i - V_{cal})^2 \qquad \text{[Equation 12]}$$

A simple difference between Equations 10 and 12 may be used as a method of investigating how appropriate it is in representing data of the straight line. When two equations are subtracted from each other, the following Equation 13 may be obtained.

$$\Sigma(V_i - V_{mean})^2 - \Sigma(V_i - V_{cal})^2 \quad \text{[Equation 13]}$$

An equation obtained by dividing Equation 12 by Equation 12 is directly a correlation coefficient (r2). Reliability of the calculated IR value may be judged with reference to this value.

The present invention is different from the related art in that a scheme of extracting the data used to calculate the internal resistance of the battery pack is also defined in the present invention even though the internal resistance of the battery pack is calculated by the same method as the method used in the related art. That is, it is possible to calculate the internal resistance of the battery pack by the method of least squares, or the like, using the current value extracted by the present invention and the voltage value according to the current value.

Figure 6:
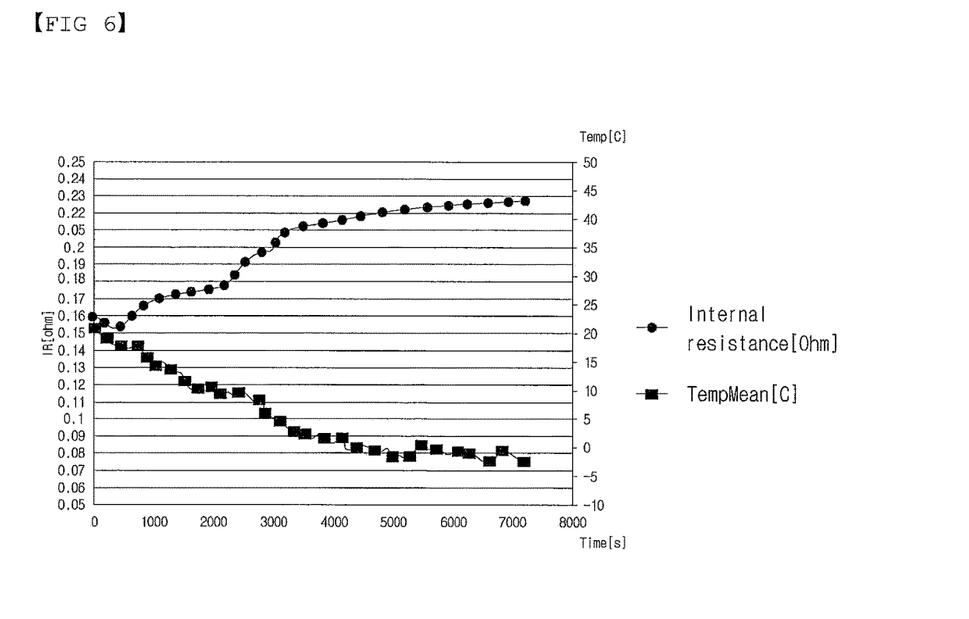
FIG. 6 is a flow chart showing an example of a result of calculating internal resistance of a battery pack for each temperature according to the exemplary embodiment of the present invention.

FIG. 6 is a flow chart showing an example of a result of calculating internal resistance of a battery pack for each temperature according to the exemplary embodiment of the present invention. In FIG. 6, the current values extracted using the method described with reference to FIG. 3 and the internal resistance values of the battery pack for each temperature calculated using the method of least squares are shown.

Figure 7:
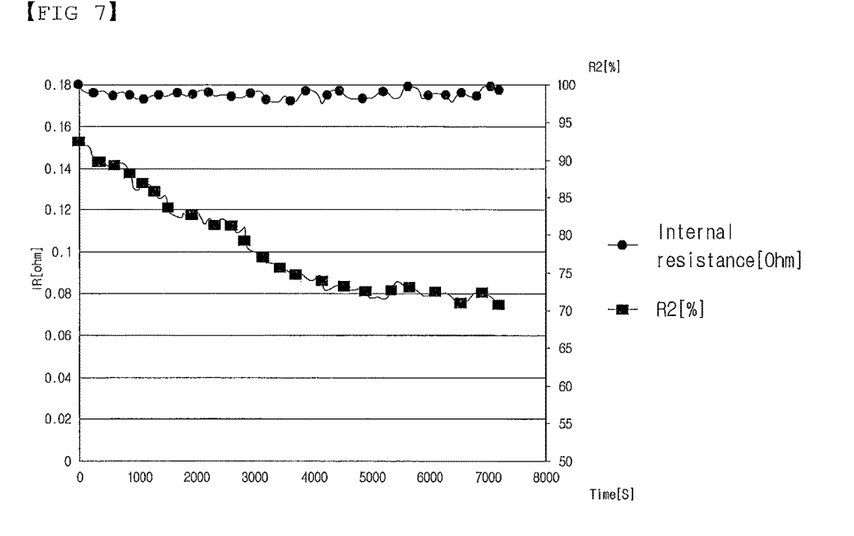
FIG. 7 is a flow chart showing an example of results of calculating internal resistance of a battery pack according to the exemplary embodiment of the present invention and R2.

FIG. 7 is a flow chart showing an example of results of calculating internal resistance of a battery pack according to the exemplary embodiment of the present invention and R2 using a method of least squares.

As set forth above, with the apparatus and method for estimating internal resistance of a battery pack according to the exemplary embodiment of the present invention, the change in current flowing in the battery pack is observed and the current value satisfying the set current change condition and the voltage and temperature values according to the current value are used, thereby making it possible to calculate the internal resistance of the battery pack and transmits the calculated internal resistance value of the battery pack to a vehicle controller of a hybrid electric vehicle or a pure electric vehicle. In addition, the calculated internal resistance value of the battery pack may be used to predict a replacement time of the battery, be used to provide an after-sales service, and be used to control and diagnose a battery state.

Although the present invention has been described with reference to the exemplary embodiments and the accompanying drawings, it is not limited to the above-mentioned exemplary embodiments but may be variously modified and changed from the above description by those skilled in the art to which the present invention pertains. Therefore, the scope and spirit of the present invention should be understood only by the following claims, and all of the equivalences and equivalent modifications to the claims are intended to fall within the scope and spirit of the present invention.

What is claimed is:

1. An apparatus for estimating internal resistance of a battery pack, comprising:
    a voltage sensing unit that measures a voltage value of the battery pack;
    a current sensing unit that measures a current value of the battery pack;
    a temperature sensing unit that measures a temperature value of the battery pack;
    at least one microcontroller on a single integrated circuit comprising a processor, memory, and programmable input/output peripherals, the processor programmed to comprise:
    (a) a condition initializing unit that initializes a current value measured in advance in the current sensing unit, a current, and a voltage;
    (b) a temperature measuring unit that stores the current value received from the current sensing unit, the voltage value received from the voltage sensing unit, and the temperature value received from the temperature sensing unit, in an arbitrarily set variable;
    (c) a current condition judging unit that judges whether the current value measured in the current sensing unit satisfies a preset current value condition;
    (d) a current value, voltage value, and temperature value storing unit that extracts and stores in the memory a current value in the case in which the current value measured in the current sensing unit satisfies the preset current value condition according to the judgment of the current condition judging unit and stores the voltage value and temperature value measured together with the current value at the time of the measurement of the current value;
    (e) estimating the internal resistance of the battery pack, wherein the processor repeats a process of extracting and storing the current value satisfying the preset current value condition according to the judgment of the current condition judging unit and storing the voltage value and temperature value measured together with the current value at the time of the measurement of the current value two times or more and then calculates the internal resistance of the battery pack using the current value, the voltage value, and the temperature value stored in the current value, voltage value, and temperature value storing unit; and
    (f) comparing, for at least two internal resistance points, temperatures to determine the effect of temperature on internal resistance of the battery; and
    a battery management system for use with a vehicle controller, predicting a replacement time of the battery pack, servicing, or for diagnosing and controlling the battery pack's state based on the estimated internal resistance of the battery.

2. The apparatus of claim 1, wherein the current condition judging unit includes:
    an initial condition judging unit that judges a condition of an initial current value sensed in the current sensing unit to judge whether the condition of the initial current value is a condition appropriate for extracting the current value;
    a condition range setting unit that sets a current value section to be extracted using the initial current value when it is judged in the initial condition judging unit that the condition of the initial current value is the condition appropriate for extracting the current value;
    a cycle counting unit that counts a time when a current value measured after the initial current value in the current sensing unit is included in the current value section set in the condition range setting unit;
    a current value extracting unit that repeats the cycle counting operation until the time counted in the cycle counting unit becomes a preset time and extracts a current value in the case in which the counted time becomes the preset time as a result of the repetition; and a current value resetting unit that does not extract current values that do not correspond to a preset low current section and resets current values that correspond to the preset low current section after one current value is first extracted in the current value extracting unit.

3. The apparatus of claim 1, wherein the condition initializing unit includes a variable initializing unit that initializes a variable value storing an initial current value and a variable value counting condition satisfaction to 0.

4. The apparatus of claim 2, wherein the initial condition judging unit includes an initial condition judging calculating unit that judges whether the initial current value corresponds to the preset low current section and compares an absolute value of the initial current value and an absolute value of the previous current value with each other to judge whether the condition of the initial current value is the condition appropriate for extracting the current value.

5. The apparatus of claim 2, wherein the condition range setting unit includes:
   an upper and lower limit width calculating unit that calculates upper and lower limit widths of the current value section by multiplying the initial current value by a preset ration; and
   a current ranging determining unit that determines upper and lower limits of the current value section though the upper and lower limit widths calculated in the upper and lower limit width calculating unit.

6. The apparatus of claim 2, wherein the current value resetting unit includes:
   an additional current value extracting limiting unit that repeatedly performs the operations before the current value resetting unit to allow the current values other than the current value first extracted in the current value extracting unit not to be additionally extracted; and
   a process initializing unit that repeatedly performs the additional current value extracting limiting operation until the current values extracted in the additional current value extracting unit correspond to a value in the preset low current section and allows a process to again start from the condition initializing unit in the case in which the current values correspond to the value in the preset low current section as a result of the repetition.

7. A battery managing method for estimating internal resistance of a battery pack, and capable of efficiently managing charging and discharging of a battery cell, comprising:
   a current, voltage, and temperature value extracting step of extracting a current value satisfying a predetermined condition and voltage and temperature values according to the current value;
   a repeating step of repeating the current, voltage, and temperature value extracting step two times or more; and
   an internal resistance calculating step of calculating the internal resistance of the battery pack using values calculated in the repeating step,
   wherein the current, voltage, and temperature value extracting step includes:

a current value measuring step of measuring a current value of the battery pack every preset period;
a condition range setting step of setting a current value section to be extracted using an initial current value first measured in the current value measuring step;
a cycle counting step of counting a time in the case in which a current value measured after the initial current value in the current value measuring step is included in the current value section set in the condition range setting step;
a current value extracting step of repeating the cycle counting step until the time counted in the cycle counting step becomes a preset time and extracting a current value in the case in which the counted time becomes the preset time as a result of the repetition;
a current value resetting step of allowing current values that do not correspond to a preset low current section not to be extracted and resetting current values that correspond to the preset low current section after one current value is first extracted in the current value extracting step, and allowing a process to again start from the current value measuring step;
an internal resistance calculating step of calculating the internal resistance of the battery pack using a current value and a voltage value extracted by repeating the current value extracting step two times or more; and
comparing, for at least two internal resistance points, temperature to determine the effect of temperature on internal resistance of the battery,
wherein the estimated internal resistance providing a battery management system input for predicting a replacement time of the battery pack, servicing, or for diagnosing and controlling the battery pack's state.

8. The method of claim 7, wherein the condition range setting step includes:
   an upper and lower limit width calculating step of calculating upper and lower limit widths of the current value section by multiplying the initial current value by a preset ratio; and
   a current ranging determining step of determining upper and lower limits of the current value section through the upper and lower limit widths calculated in the upper and lower limit width calculating step.

9. The method of claim 7, wherein the current value resetting step includes:
   an additional current value extracting limiting step of repeatedly performing the steps before the current value resetting step to allow the current values other than the current value first extracted in the current value extracting step not to be extracted; and
   a process initializing step of repeatedly performing the additional current value measuring step until the current values measured in the additional current value extracting step correspond to a value in the preset low current section and allowing the process to again start from the current value measuring step in the case in which the current values correspond to the value in the preset low current section as a result of the repetition.

* * * * *